United States Patent
Son et al.

(10) Patent No.: US 9,007,856 B2
(45) Date of Patent: Apr. 14, 2015

(54) REPAIR CONTROL CIRCUIT AND SEMICONDUCTOR MEMORY DEVICE INCLUDING THE SAME

(71) Applicant: Samsung Electronics Co., Ltd., Suwon-si (KR)

(72) Inventors: Jong-Pil Son, Seongnam-si (KR); Jae-Sung Kim, Suwon-si (KR); Uk-Song Kang, Seongnam-si (KR); Young-Soo Sohn, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 65 days.

(21) Appl. No.: 13/804,690

(22) Filed: Mar. 14, 2013

(65) Prior Publication Data
US 2014/0140153 A1    May 22, 2014

Related U.S. Application Data

(60) Provisional application No. 61/728,911, filed on Nov. 21, 2012.

(30) Foreign Application Priority Data

Mar. 6, 2013    (KR) .......................... 10-2013-0023938

(51) Int. Cl.
*G11C 7/00* (2006.01)
*G11C 29/04* (2006.01)
*G11C 29/44* (2006.01)

(52) U.S. Cl.
CPC ........ *G11C 29/04* (2013.01); *G11C 2029/4402* (2013.01)

(58) Field of Classification Search
USPC ............................................ 365/200, 185.09
See application file for complete search history.

(56) References Cited

U.S. PATENT DOCUMENTS

| | | | |
|---|---|---|---|
| 5,566,128 A | 10/1996 | Magome | |
| 7,222,271 B2 | 5/2007 | Ruckerbauer et al. | |
| 7,339,844 B2 | 3/2008 | Krech et al. | |
| 2001/0042161 A1* | 11/2001 | Tomita | 711/105 |
| 2002/0024859 A1* | 2/2002 | Ooishi | 365/200 |
| 2008/0256094 A1 | 10/2008 | Gupta et al. | |

FOREIGN PATENT DOCUMENTS

JP    07-230686 A    8/1995

* cited by examiner

*Primary Examiner* — Anthan Tran
(74) *Attorney, Agent, or Firm* — Lee & Morse, P.C.

(57) ABSTRACT

A repair control circuit of controlling a repair operation of a semiconductor memory device includes a row matching block and a column matching block. The row matching block stores fail group information indicating one or more fail row groups among a plurality of row groups. The row groups are determined by grouping a plurality of row addresses corresponding to a plurality of wordlines. The row matching block generates a group match signal based on input row address and the fail group information, such that the group match signal indicates the fail row group including the input row address. The column matching block stores fail column addresses of the fail memory cells, and generates a repair control signal based on input column address, the group match signal and the fail column addresses, such that the repair control signal indicates whether the repair operation is executed or not.

21 Claims, 14 Drawing Sheets

| GROUP INDEX | REMAINDER | GROUP ADDRESS | | | GROUP BIT |
|---|---|---|---|---|---|
| 0 | 0~63 | 0 | 0 | 0 | 0 |
| 1 | 64~127 | 0 | 0 | 1 | 0 |
| 2 | 128~191 | 0 | 1 | 0 | 1 |
| 3 | 192~255 | 0 | 1 | 1 | 1 |
| 4 | 256~319 | 1 | 0 | 0 | 0 |
| 5 | 320~383 | 1 | 0 | 1 | 1 |
| 6 | 384~447 | 1 | 1 | 0 | 1 |
| 7 | 448~511 | 1 | 1 | 1 | 0 |

| GROUP INDEX | REMAINDER | GROUP ADDRESS | | | GROUP BIT |
|---|---|---|---|---|---|
| 0 | 0 | 0 | 0 | 0 | 1 |
| 1 | 1 | 0 | 0 | 1 | 0 |
| 2 | 2 | 0 | 1 | 0 | 0 |
| 3 | 3~255 | 0 | 1 | 1 | 1 |
| 4 | 256~508 | 1 | 0 | 0 | 1 |
| 5 | 509 | 1 | 0 | 1 | 0 |
| 6 | 510 | 1 | 1 | 0 | 1 |
| 7 | 511 | 1 | 1 | 1 | 1 |

REPAIR CONTROL CIRCUIT AND SEMICONDUCTOR MEMORY DEVICE INCLUDING THE SAME

CROSS-REFERENCE TO RELATED APPLICATION

The present application claims priority under 35 U.S.C. §119 to U.S. Provisional Application No. 61/728,911 filed on Nov. 21, 2012 in the USPTO, and Korean Patent Application No. 10-2013-0023938, filed on Mar. 6, 2013 in the Korean Intellectual Property Office, and entitled: "Repair Control Circuit and Semiconductor Memory Device Including the Same," which is incorporated herein by reference in its entirety.

BACKGROUND

1. Field

Example embodiments relate generally to semiconductor integrated circuits and more particularly to a repair control circuit and a semiconductor memory device including the repair control circuit for replacing fail memory cells with redundancy memory cells in the semiconductor memory device.

2. Description of the Related Art

Semiconductor memory devices include a plurality of memory cells that are arranged in a matrix form of a plurality of rows and a plurality of columns. The rows may correspond to wordlines to which respective row addresses are assigned and the columns may correspond to bitlines to which respective column addresses are assigned. The semiconductor memory devices may include normal memory cells and redundancy memory cells for replacing fail memory cells among the normal memory cells. In the conventional memory device, a row repair operation may be performed to replace one wordline with one redundancy wordline or a column repair operation may be performed to replace one bitline with one redundancy bitline.

As the integration density of the semiconductor memory device is increased, single-bit fail rate is increased. When the single-bit fail is dominant, the row-by-row repair and the column-by-column repair are inefficient because repair resources may be exhausted excessively and thus the integration density may be degraded. In case of implementing the bit-by-bit repair, the size or the occupation area of the peripheral circuitry is increased significantly to control the bit-by-bit repair operation.

SUMMARY

At least one example embodiment of the inventive concept provides a repair control circuit, capable of efficiently controlling a repair operation for single-bit fail.

At least one example embodiment of the inventive concept provides a semiconductor memory device, capable of performing the repair operation for single-bit fail using the repair control circuit.

According to an example embodiment of the inventive concept, a repair control circuit controlling a repair operation of a semiconductor memory device includes a row matching block and a column matching block. The row matching block stores fail group information indicating one or more fail row groups among a plurality of row groups, where the row groups are determined by grouping a plurality of row addresses corresponding to a plurality of wordlines, and each of the fail row groups includes one or more fail row addresses of fail memory cells. The row matching block generates a group match signal based on input row address and the fail group information, such that the group match signal indicates the fail row group including the input row address. The column matching block stores fail column addresses of the fail memory cells, and generates a repair control signal based on input column address, the group match signal and the fail column addresses, such that the repair control signal indicates whether the repair operation is executed or not.

The row matching block may store fail group addresses as the fail group information. The fail group addresses may indicate the fail row groups, and a bit number of each fail group address may be smaller than a bit number of each fail row address.

The fail group addresses may be hashing values that are converted from the fail row addresses using a hashing function.

The fail group addresses may be determined by grouping remainders of the fail row addresses when divided by a reference value. A memory cell array of the semiconductor memory device may include a plurality of sub arrays, and the reference value may correspond to a number of wordlines in each sub array.

A wordline number of a first row group corresponding to an edge portion of each sub array may be smaller than a wordline number of a second row group corresponding to a center portion of each sub array.

The row matching block may include a group address storage configured to store the fail group addresses, an address convertor configured to convert the input row address to an input group address indicating the row group including the input row address, and a group comparator configured to compare the input group address with the fail group addresses to generate the group match signal.

The row matching block may store group bits as the fail group information. The group bits may respectively correspond to the row groups. Each group bit may have a first logic value when the corresponding row group is the fail row group and a second logic value when the corresponding row group is not the fail row group.

The row matching block may include a bloom filter table configured to store the group bits, an address convertor configured to convert the input row address to an input group address indicating the row group including the input row address, and a signal generator configured to extract the logic value of the group bit corresponding to the input group address from the bloom filter table to generate the group match signal.

The column matching block may include a column address storage configured to store the fail column addresses, and configured to output the fail column addresses corresponding to the fail row group including the input row address in response to the group match signal, and a column comparator configured to compare the input column address with the fail column addresses output from the column address storage to generate the repair control signal.

The column address storage may include a plurality of storage units for storing the one or more fail column addresses with respect to each fail row group. The repair control signal may include a plurality of bit signals indicating a column address of the redundancy memory cell for replacing the fail memory cell corresponding to the input row address and the input column address, and indicating whether the repair operation is executed or not.

According to an example embodiment of the inventive concept, a semiconductor memory device includes a memory cell array, a row selection circuit, a column selection circuit and a repair control circuit The memory cell array includes a plurality of memory cells coupled to a plurality of wordlines and a plurality of normal bitlines, respectively, and a plurality of redundancy memory cells coupled to the plurality of wordlines and a plurality of redundancy bitlines. The row selection circuit selects one of the wordlines based on input row address. The column selection circuit selects one of the normal bitlines based on an input column address in a normal operation and selects one of the redundancy bitlines based on a repair control signal in a repair operation. The repair control circuit stores fail group information and fail column addresses of fail memory cells. The fail group information indicates one or more fail row groups among a plurality of row groups, and the row groups is determined by grouping a plurality of row addresses corresponding to the plurality of wordlines. Each of the fail row groups includes one or more fail row addresses of the fail memory cells. The repair control circuit generates the repair control signal based on the input row address, the input column address, the fail group information and the fail column addresses.

The repair control circuit may include a row matching block configured to store the fail group information and configured to generate a group match signal based on the input row address and the fail group information, the group match signal indicating whether the row group including the input row address is the fail row group or not, and a column matching block configured to store the fail column addresses and configured to generate the repair control signal based on the input column address, the group match signal and the fail column addresses, the repair control signal indicating whether the repair operation is executed or not.

The row matching unit may include a group address storage configured to store fail group addresses as the fail group information, the fail group addresses indicating the fail row groups, a bit number of each fail group address being smaller than a bit number of each fail row address.

The row matching block may include a bloom filter table configured to store group bits as the fail group information, the group bits respectively corresponding to the row groups, each group bit having a first logic value when the corresponding row group is the fail row group and a second logic value when the corresponding row group is not the fail row group.

The row matching may block include an address convertor configured to convert the input row address to an input group address indicating the row group including the input row address.

The semiconductor memory device may further include a non-volatile memory configured to store the fail group information and the fail column addresses. The fail group information and the fail column addresses in the non-volatile memory may be loaded to a volatile memory included in the repair control circuit during an initializing process of the semiconductor memory device.

First memory cells and second memory cells may be replaced with the redundancy memory cells coupled to the same redundancy bitline, where the first memory cells and second memory cells are coupled to the different normal bitlines and included in the different row groups.

According to an example embodiment of the inventive concept, a repair control circuit controlling a repair operation of a semiconductor memory device includes a memory configured to store fail group information and fail column addresses of fail memory cells, the fail group information indicating one or more fail row groups among a plurality of row groups, an address convertor configured to group a plurality of row addresses corresponding to a plurality of wordlines into the plurality of row groups, each of the fail row groups including one or more fail row addresses of the fail memory cells, and a comparison unit configured to generate the repair control signal based on an input row address, an input column address, the fail group information, and the fail column addresses.

The fail group addresses may be determined by grouping remainders of the fail row addresses when divided by a reference value, a memory cell array of the semiconductor memory device including a plurality of sub arrays, the reference value corresponding to a number of wordlines in each sub array.

A number of wordlines in a first row group at an edge portion of each sub array may be smaller than a number of wordlines of a second row group at a center portion of each sub array.

BRIEF DESCRIPTION OF THE DRAWINGS

Example embodiments of the inventive concept will be more clearly understood from the following detailed description taken in conjunction with the accompanying drawings.

DETAILED DESCRIPTION

Figure 1:
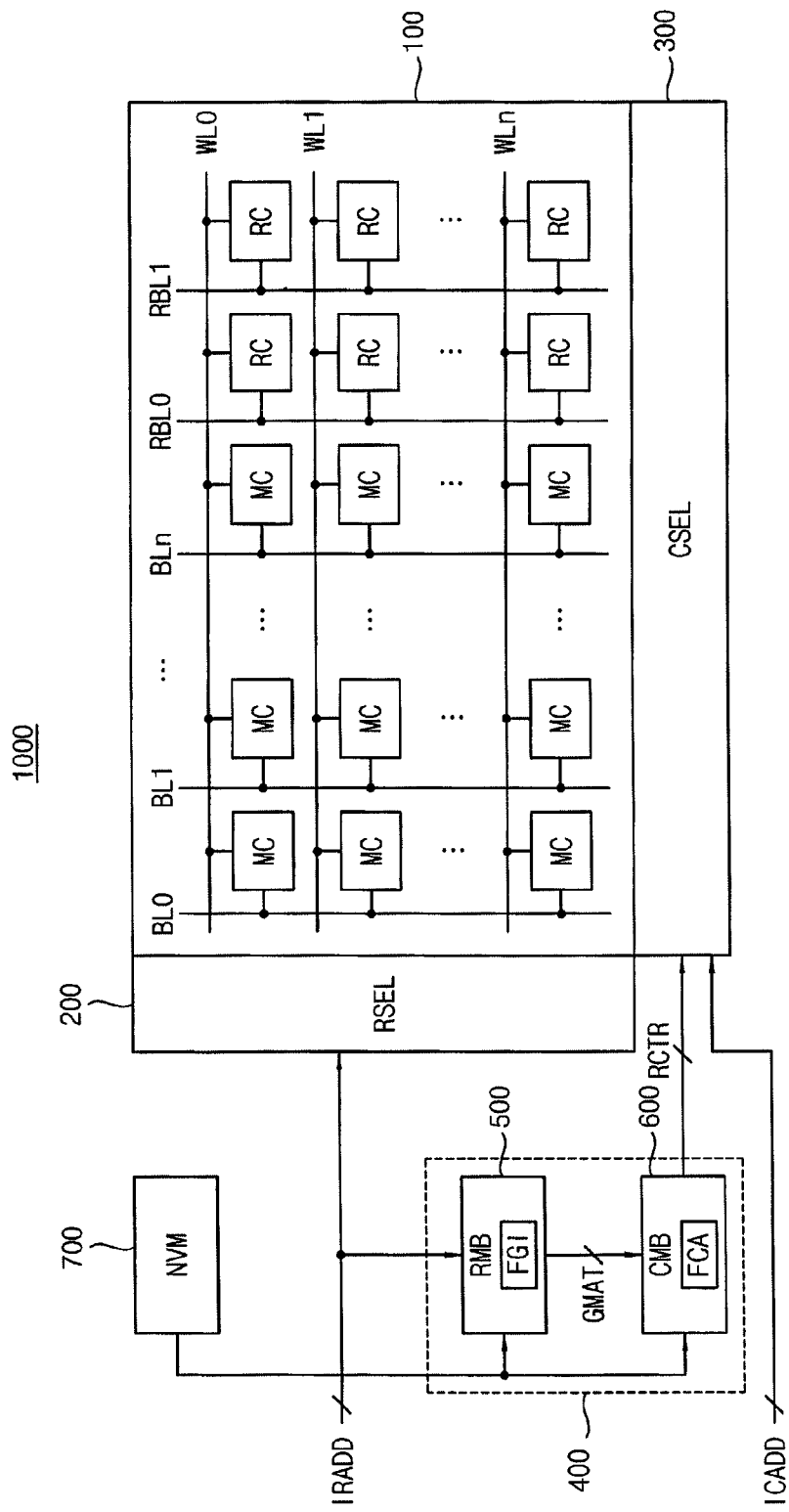
FIG. 1 illustrates a block diagram of a semiconductor memory device including a repair control circuit according to an example embodiment of the inventive concept.

The inventive concept will be described more fully hereinafter with reference to the accompanying drawings, in which some example embodiments of the inventive concept are shown. The inventive concept may, however, be embodied in many different forms and should not be construed as limited to the example embodiments set forth herein. In the drawings, the sizes and relative sizes of layers and regions may be exaggerated for clarity. Like numerals refer to like elements throughout.

It will be understood that when an element is referred to as being "connected" or "coupled" to another element, it can be directly connected or coupled to the other element or intervening elements may be present. As used herein, the singular forms "a," "an" and "the" are intended to include the plural forms as well, unless the context clearly indicates otherwise.

Figure 2:
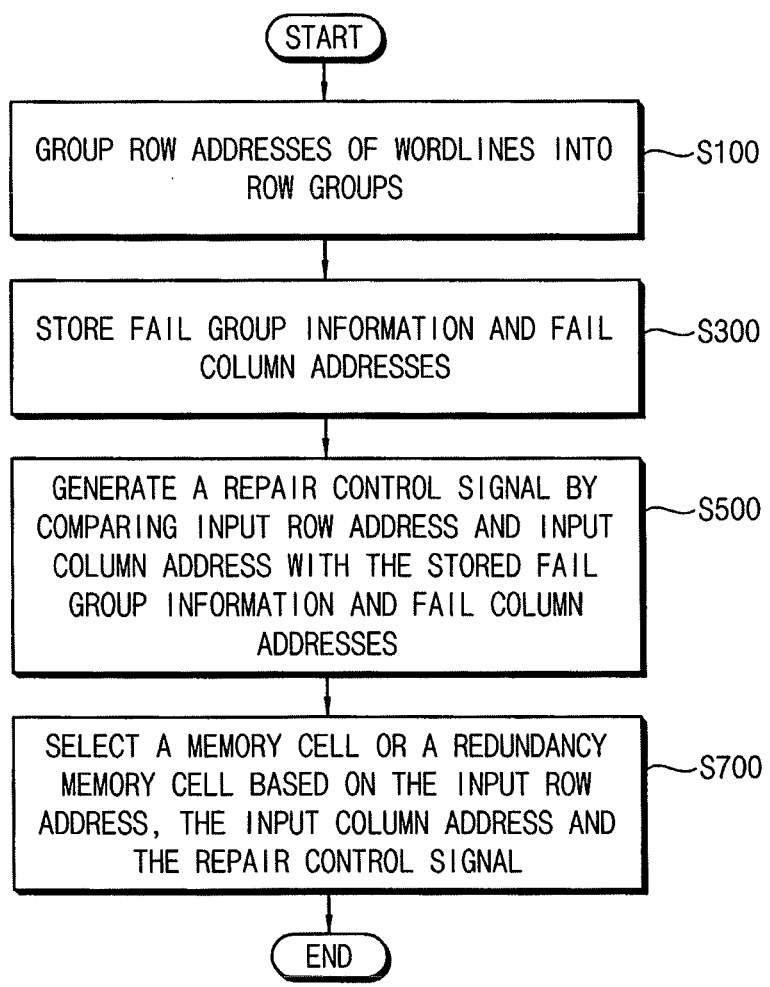
FIG. 2 illustrates a flow chart of a method of controlling a repair operation in a semiconductor memory device according to an example embodiment of the inventive concept.

It should also be noted that in some alternative implementations, the functions/acts noted in the blocks of a method may occur out of the order noted in the illustrated flowcharts (e.g., see FIG. 2). For example, two blocks shown in succession may in fact be executed substantially concurrently or the blocks may sometimes be executed in the reverse order, depending upon the functionality/acts involved.

FIG. 1 illustrates a block diagram of a semiconductor memory device including a repair control circuit according to an example embodiment of the inventive concept. Referring to FIG. 1, a semiconductor memory device 1000 may include a memory cell array 100, a row selection circuit (RSEL) 200, a column selection circuit (CSEL) 300, and a repair control circuit 400.

The memory cell array 100 includes a plurality of memory cells MCs coupled to a plurality of wordlines WL0~WLm and a plurality of normal bitlines BL0~BLn, respectively, and a plurality of redundancy memory cells RCs coupled to the plurality of wordlines WL0~WLm and a plurality of redundancy bitlines RBL0 and RBL1. The memory cells MCs and the redundancy memory cells RCs share the wordlines WL0~WLm to be accessed using the common row addresses, respectively. FIG. 1 illustrates the two redundancy bitlines for convenience of illustration, the number of the redundancy bitlines may be varied.

The row selection circuit 200 selects one of the wordlines WL0~WLm based on input row address IRADD. The row selection circuit 200 may include a row decoder, a wordline driver circuit, etc. The column selection circuit 300 selects one of the normal bitlines BL0~BLn based on an input column address ICADD in a normal operation and selects one of the redundancy bitlines RBL0 and RBL1 based on a repair control signal RCTR in a repair operation. The column selection circuit 300 may include a gating circuit, a column decoder, etc. As will be described with reference to FIG. 7, the repair control signal RCTR may indicate whether the repair operation has to be executed or not. In other words, the repair control signal RCTR may selectively indicate normal operation or repair operation.

The repair control circuit 400 stores fail group information FGI and fail column addresses FCA of fail memory cells. The fail group information FGI indicates one or more fail row groups among a plurality of row groups, where the row groups are determined by grouping a plurality of row addresses corresponding to the plurality of wordlines WL0~WLm. Each of the fail row groups includes one or more fail row addresses of the fail memory cells. The repair control circuit 400 generates the repair control signal RCTR based on the input row address IRADD, the input column address ICADD, the fail group information FGI, and the fail column addresses FCA.

As illustrated in FIG. 1, the repair control circuit 400 may include a row matching block 600 and a column matching block 600. The row matching block 500 stores the fail group information FGI and generates a group match signal GMAT based on the input row address IRADD and the stored fail group information FGI such that the group match signal GMAT may indicate whether the row group including the input row address IRADD is the fail row group or not. The column matching block 600 stores the fail column addresses FCA and generates the repair control signal RCTR based on the input column address ICADD, the group match signal GMAT, and the stored fail column addresses FCA, such that the repair control signal RCTR indicates whether the repair operation has to be executed or not.

In an example embodiment, as illustrated in FIG. 1, the semiconductor memory device 1000 may further include a non-volatile memory (NVM) 700. The non-volatile memory 700 stores the fail group information FGI and the fail column addresses FCA. Through a testing process using an external tester, address information on the fail memory cells in the memory cell array 100 may be detected and the results may be written in the non-volatile memory 700 in the form of the fail group information FGI and the fail column addresses FCA. As described below with reference to FIGS. 3 and 4, the fail row addressed of the fail memory cells are converted to the fail group addresses or the group bits. The fail group information FGI and the fail column addresses FCA in the non-volatile memory 700 may be loaded to a volatile memory included in the repair control circuit 400 during an initializing process of the semiconductor memory device 1000.

In an example embodiment, the semiconductor memory device 1000 may include a built-in self test (BIST) circuitry, and the fail group information FGI and the fail column addresses FCA may be provided to the repair control circuit 400 through a testing process using the BIST circuit. In this case, the non-volatile memory 700 may be omitted.

When the conventional memory device includes the repair resources such as the redundancy memory cells RCs and the redundancy bitlines RBL0 and RBL1 in FIG. 1, the conventional memory device performs column-by-column repair operation. Even though only one memory cell is failed among memory cells coupled to one normal bitline, the other good cells have to be replaced with the redundancy memory cells. Accordingly, such column-by-column repair is inefficient because repair resources may be exhausted excessively. Many redundancy bitlines are required to perform the column-by-column repair and, thus, the integration density may be degraded. In case of implementing a bit-by-bit repair, the size or the occupation area of the repair control circuit 400 for determining whether the accessed memory cell is the fail memory cell is increased significantly. Thus, the integration rate of the semiconductor memory device 1000 is degraded.

According to example embodiments of the inventive concept, the row addresses of the wordlines are grouped into row groups and a group-by-group repair operation is performed to use the repair resources efficiently. Thus, the size or the occupation area of the repair control circuit 400 and the semiconductor memory device 1000 may be reduced.

FIG. 2 illustrates a flow chart of a method of controlling a repair operation in a semiconductor memory device according to an example embodiment of the inventive concept. Referring to FIGS. 1 and 2, the row addresses of wordlines are grouped into the row groups (S100). The grouping method may be determined according to the operational scenario of the semiconductor memory device 1000, and the format of the fail group information FGI and the configuration of the repair control circuit 400 may be determined according to the grouping method.

The repair control circuit 400 stores the fail group information FGI and the fail column addresses FCA (S300). As described above, the fail group information FGI and the fail column addresses FCA may be stored in advance in the non-volatile memory 700 to be retained even during the power-off state. The initialization process is performed when the semiconductor memory device 1000 is powered, and the fail group information FGI and the fail column addresses FCA may be loaded to the repair control circuit 400 from the non-volatile memory 700 for implementing the rapid repair operation.

The repair control circuit 400 generates the repair control signal RCTR by comparing the input row address IRADD and input column address ICADD with the stored fail group information FGI and fail column addresses FCA (S500). The grouping method and the generation of the repair control signal RCTR are described below with reference to FIGS. 3 through 13.

The row and column selection circuits 200 and 300 select the memory cell MC or the redundancy memory cell RC based on the input row address IRADD, the input column address ICADD, and the repair control signal RCTR. In the normal operation to access the good memory cell, the row selection circuit 200 selects or enables the one wordline corresponding to the input row address IRADD and the column selection circuit 300 selects the one normal bitline corresponding to the input column address ICADD. The write operation or the read operation is performed with respect to the accessed memory cell that is coupled to the selected wordline and the selected normal bitline. In the repair operation to access the fail memory cell, the column selection circuit 300 selects the one redundancy bitline corresponding to the repair control signal RCTR instead of the normal bitline and, thus, the fail memory cell coupled to the normal bitline is replaced with the redundancy memory cell coupled to the redundancy bitline.

Hereinafter, the configuration and the operation of the repair control circuit 400 and the semiconductor memory device 1000 are described in detail referring to the example embodiments of FIGS. 3 through 13.

Figure 3:
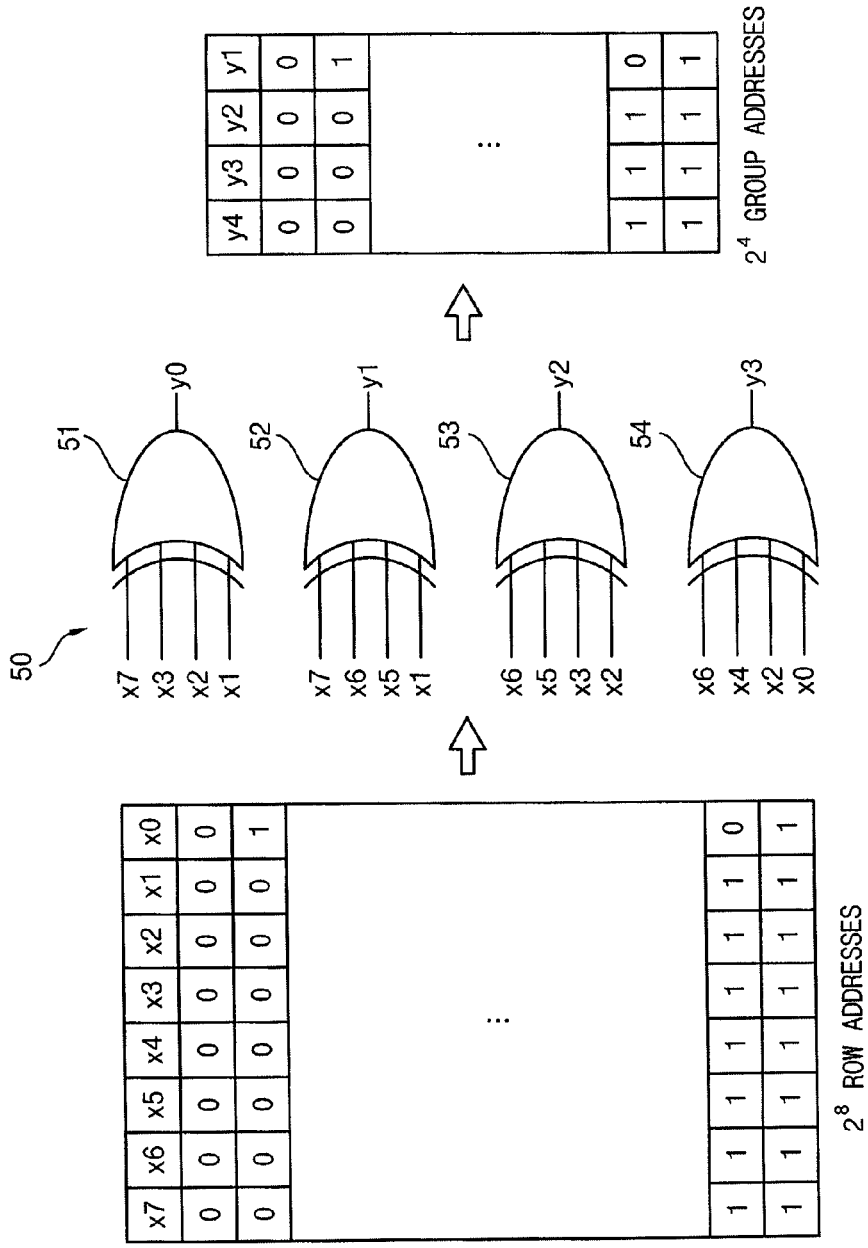
FIG. 3 illustrates a diagram of a method of determining row groups according to an example embodiment of the inventive concept.

FIG. 3 illustrates a diagram of a method of determining row groups according to an example embodiment of the inventive concept. In an example embodiment, the above-mentioned row groups may be determined using a hashing function. The 8-bit row addresses of the wordlines and 4-bit group addresses of the row groups are illustrated in FIG. 3 for convenience of description, the bit number of each row address, the number of the row groups and the bit-number of each group address may be varied.

Referring to FIG. 3, the grouping method using the hashing function may be represented by a hashing logic 50. For example, the hashing logic 50 may include a plurality of exclusive OR (XOR) logic gates 51, 52, 53, and 54. The XOR logic gates 51, 52, 53, and 54 perform the XOR logic operations on the respective four bits among the eight bits of each row address to provide the four bits of each group address. As a result, each 8-bit row address is converted to each 4-bit group address, and thus the $2^8$ (=512) row addresses from (00000000) to (11111111) are grouped into $2^4$ row groups corresponding to the $2^4$ group addresses from (0000) to (1111).

Even though FIG. 3 illustrates an example hashing logic including the XOR logic gates 51, 52, 53 and 54, the hashing logic may be determined variously according to the scenario of the semiconductor memory device 1000. For example, a mid-square function, a division function, a folding function, a radix function etc. or a combination thereof may be used as the hashing function for determining the row groups.

Figure 4:
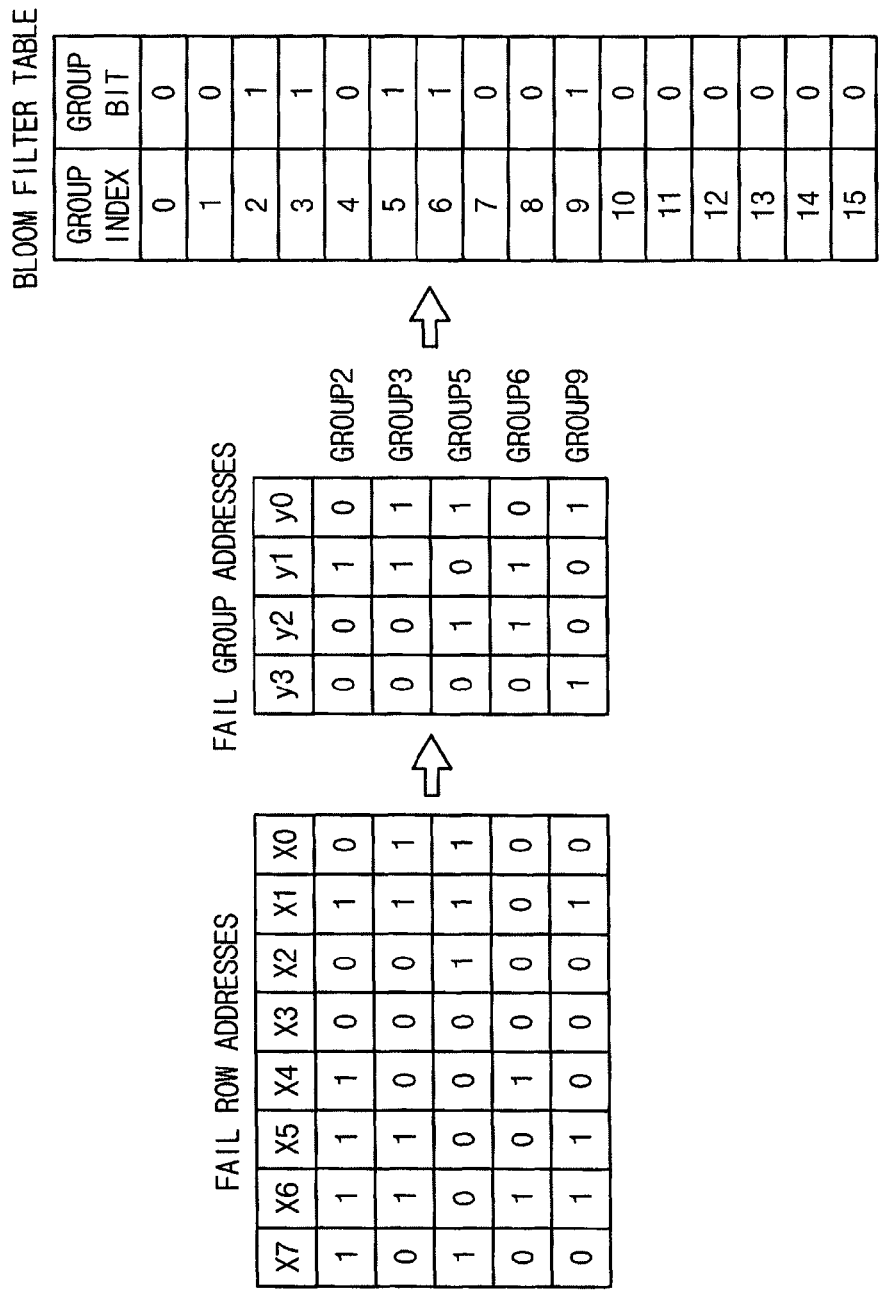
FIG. 4 illustrates a diagram of a method of storing fail group information based on the row groups in FIG. 3 according to an example embodiment of the inventive concept.

FIG. 4 illustrates a diagram of a method of storing fail group information based on the row groups in FIG. 3 according to an example embodiment of the inventive concept. FIG. 4 illustrates the five fail row addresses of the fail memory cells as an example, the fail group addresses converted from the fail row addresses to indicate the fail row groups and the bloom filter table in which the group bits are mapped with the group indices so that the logic values of the group bits may indicate the fail row groups.

The fail group addresses may be hashing values that are converted from the fail row addresses using a hashing function, e.g., the hashing logic 50 as illustrated in FIG. 3, and the bit number (e.g. four) of each fail group address becomes smaller than the bit number (e.g., eight) of each fail row address. The above mentioned fail group information FGI may be the fail group addresses.

Also, the fail group information FGI may be represented by the bloom filter table in which the group bits are mapped to the group indices so that the group bits may respectively correspond to the row groups. Each group bit may have a first logic value when the corresponding row group is the fail row group and a second logic value when the corresponding row group is not the fail row group. As illustrated in FIG. 4, the fail group information FGI may be represented, such that the logic high value "1" is written in the group bits mapped to the group indices 2, 3, 5, 6, and 9 to indicate the fail row groups, and the logic low value "0" is written in the other group bits.

In an example embodiment, as described with reference to FIG. 5, the row matching block 500 in the repair control circuit 400 may store the fail group addresses as the fail group information FGI. In another example embodiment, as described with reference to FIG. 13, the row matching block 500 in the repair control circuit 400 may store the group bits mapped to the group indices as the fail group information FGI.

Figure 5:
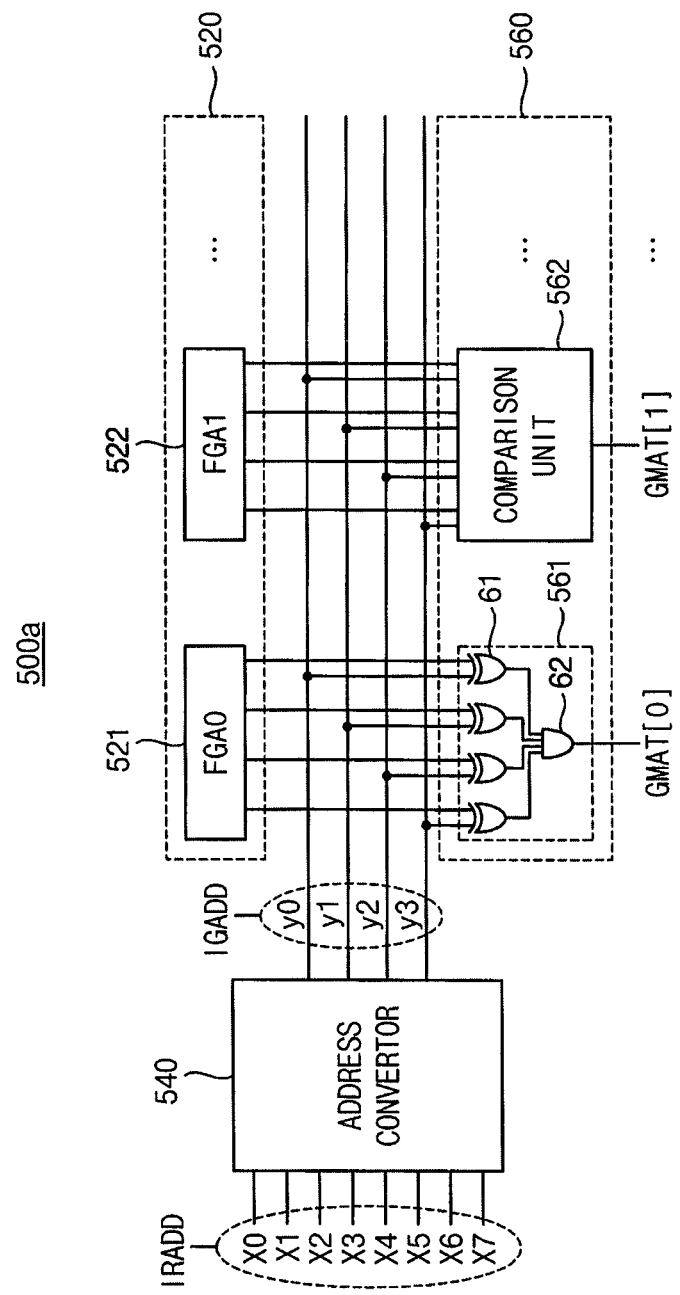
FIG. 5 illustrates a diagram of a row matching block in the repair control circuit in FIG. 1 according to an example embodiment of the inventive concept.

FIG. 5 illustrates a diagram illustrating a row matching block in the repair control circuit in FIG. 1 according to an example embodiment of the inventive concept. Referring to FIG. 5, the row matching block 500*a* may include a group address storage 520, an address convertor 540, and a group comparator 560.

The group address storage 520 stores the fail group addresses FGA0 and FGA1 having the smaller bits that the fail row addresses. The group address storage 520 may include a plurality of storage units 521 and 522 to store the respective fail group addresses FGA0 and FGA1. The number of the storage units may be varied according to the structure of the memory cell array 100 in the semiconductor memory device 1000. For example, the number of the storage units may correspond to an entire number of row groups depending on the grouping method.

The address convertor 540 receives the input row address IRADD and converts the input row address IRADD to an input group address IGADD indicating the row group including the input row address IRADD. The address convertor 540 may have the same configuration as the hashing logic 50 that performs the hashing function to convert the fail row addresses to the fail group addresses.

The group comparator 560 compares the input group address IGADD with the fail group addresses FGA0 and FGA1 to generate the group match signal GMAT. The group comparator 560 may include a plurality of comparison units 561 and 562 to compare the respective fail group addresses FGA0 and FGA1 with the input group address IGADD. For example, the first comparison unit 561 may include a plurality of XOR logic gates 61 and an AND gate 62. The XOR logic gates 61 performs the bit-by-bit comparison of the first fail group address FGA0 and the input group address IGADD and the AND logic gate 62 performs an AND logic operation on the outputs of the XOR logic gates 61 to generate the first bit signal GMAT[0] of the group match signal GMAT. The first bit signal GMAT[0] may be activated to the logic high level when the first fail group address FGA0 is equal to the input group address IGADD, and deactivated to the logic low level when the first fail group address FGA0 is different from the input group address IGADD. In the same way, the second comparison unit 562, having the same configuration as the first comparison unit 561, may generate the second bit signal GMAT[1] of the group match signal GMAT, which is activated to the logic high level when the second fail group address FGA1 is equal to the input group address IGADD, and deactivated to the logic low level when the second fail group address FGA1 is different from the input group address IGADD. The group match signal GMAT may include a plurality of the bit signals GMAT[0] and GMAT[1], and the bit signals GMAT[0] and GMAT[1] may indicate the fail row group including the input row address IRADD. One of the bit signals GMAT[0] and GMAT[1] is activated when the input row address IRADD belongs to one of the fail row groups, and all of the bit signals GMAT[0] and GMAT[1] are deactivated when the input row address IRADD does not belong to any of the fail row groups.

As such, by grouping the row addresses, storing the fail group addresses FGA0 and FGA1 of the smaller bit number instead of the fail row addresses, and comparing the fail group addresses FGA0 and FGA1 with the input group address IGADD, the occupation area of the address storage 520 for storing the fail cell information and the occupation area of the group comparator 560 may be reduced. The reduction of the occupation area is significant as the integration rate and the cell numbers of the semiconductor memory device 1000 are increased.

Figure 6:
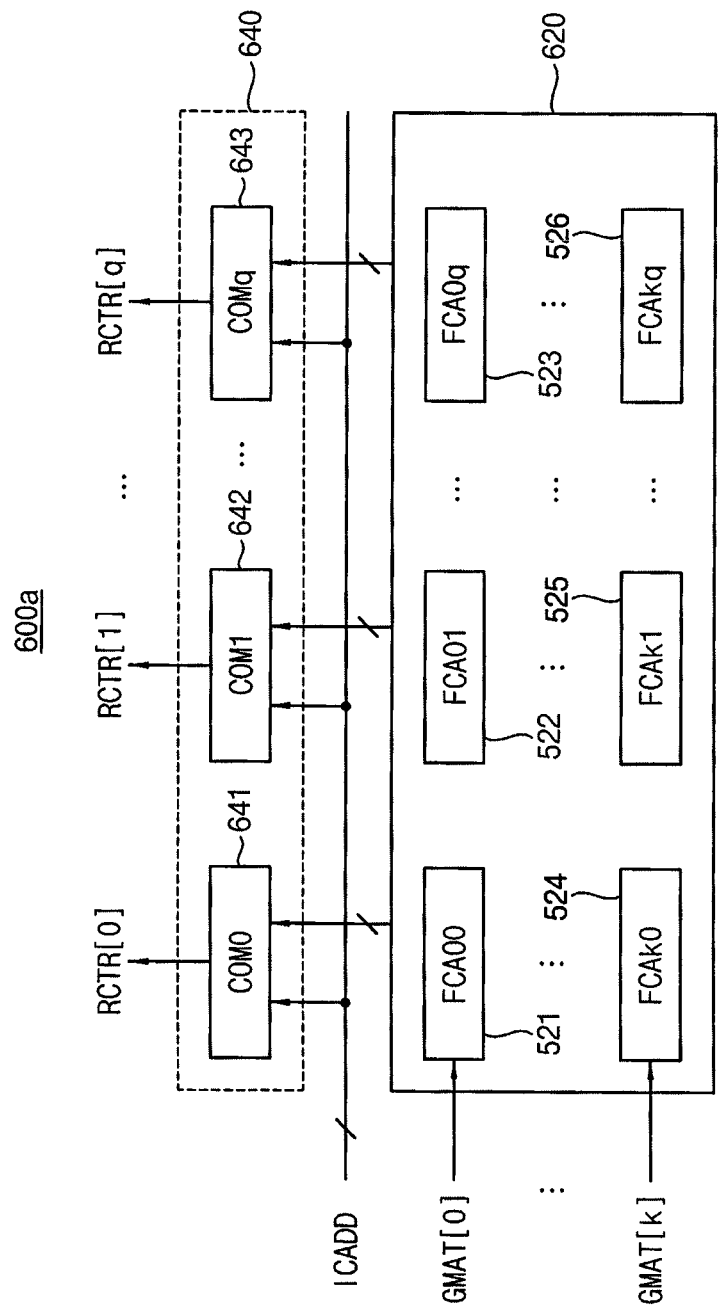
FIG. 6 illustrates a diagram of a column matching block in the repair control circuit in FIG. 1 according to an example embodiment of the inventive concept.

FIG. 6 illustrates a diagram of a column matching block in the repair control circuit in FIG. 1 according to an example embodiment of the inventive concept. Referring to FIG. 6, the column matching block 600a may include a column address storage 620 and a column comparator 640.

The column address storage 620 stores the fail column addresses FCA00, FCA01, FCA0q, FCAk0, FCAk1, and FCAkq. The column address storage 620 may include a plurality of storage units 521, 522, 523, 524, 525, and 526 to store the respective fail column addresses FCA00, FCA01, FCA0q, FCAk0, FCAk1, and FCAkq, respectively. The column address storage 620 may output the fail column addresses corresponding to the fail row group including the input row address IRADD in response to the group match signal GMAT[0]~GMAT[k]. For example, the column address storage 620 may select the storage units 521, 522, and 523 in the first row to output the FCA00, FCA01, and FCA0q stored therein when the first bit signal GMAT[0] is activated, and the column address storage 620 may select the storage units 524, 525, and 526 in the k-th row to output the FCAk0, FCAk1 and FCAkq stored therein when the k-th bit signal GMAT[0] is activated. Depending on the distribution of the fail memory cells in the memory cell array 100 in FIG. 1, some of the storage units 521, 522, 523, 524, 525, and 526 may be empty, e.g., may store default values.

The column comparator 640 compares the input column address ICADD with the fail column addresses output from the column address storage 620 to generate the repair control signal RCTR. The column comparator 640 may include a plurality of comparison units 641, 642, and 643 to compare the input column address ICADD with the respective fail column addresses. For example, the first comparison unit 641 may compare the input column address ICADD with one of the fail column addresses FCA00 and FCAk0 output from the first column of the column address storage 620. The first comparison unit 641 may generate the first bit signal RCTR[0] of the repair control signal RCTR, which is activated to the logic high level when the input column address ICADD is equal to the fail group address output from the first column of the column address storage 620 and is deactivated to the logic low level when the input column address ICADD is different from the fail group address output from the first column of the column address storage 620. In the same way, the second comparison unit 642 may generate the second bit signal RCTR[1] of the repair control signal RCTR, which is activated when the input column address ICADD is equal to the fail column address from the second column of the column address storage 620, and so forth.

As such, the repair control signal RCTR may include a plurality of the bit signals RCTR[0], RCTR[1], and RCTR[q] that indicate whether the input column address ICADD is equal to one of the stored fail column addresses of the fail row group including the input row address IRADD. One of the bit signals RCTR[0], RCTR[1], and RCTR[q] is activated when the input column address ICADD is equal to one of the fail column addresses output from the column address storage 620 and all of the bit signals RCTR[0], RCTR[1], and RCTR[q] are deactivated when the input column address ICADD is not equal to any of the fail column addresses output from the column address storage 620.

The repair control signal RCTR including the plurality of the bit signals RCTR[0], RCTR[1], and RCTR[q] may indicate, in addition to whether the repair operation is executed or not, a column address of the redundancy memory cell RC for replacing the fail memory cell MC corresponding to the input row address IRADD and the input column address ICADD. The repair control signal RCTR may indicate the normal operation for accessing the memory cell MC when all of the bit signals RCTR[0], RCTR[1], and RCTR[q] are deactivated, and may indicate the repair operation for replacing the memory cell MC with the redundancy memory cell RC when one of the bit signals RCTR[0], RCTR[1], and RCTR[q] is activated. As described below with reference to FIG. 7, the selective activation of the bit signals RCTR[0], RCTR[1], and RCTR[q] may indicate the column address of the redundancy memory cell RC, i.e., the one redundancy bitline for the repair operation.

Figure 7:
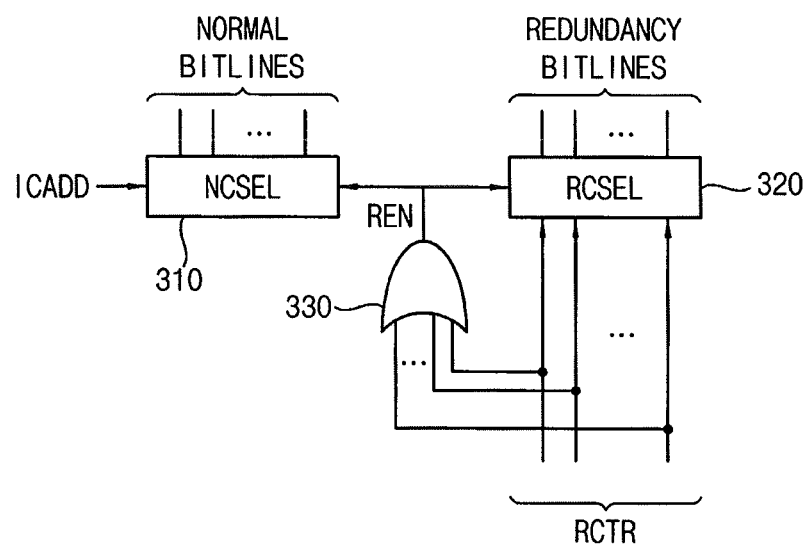
FIG. 7 illustrates a diagram of a column selection circuit in the semiconductor memory device of FIG. 1 according to an example embodiment of the inventive concept.

FIG. 7 illustrates a diagram of a column selection circuit in the semiconductor memory device of FIG. 1 according to an example embodiment of the inventive concept. Referring to FIG. 7, the column selection circuit 300a may include a normal column selection circuit (NCSEL) 310, a redundancy column selection circuit (RCSEL) 320, and a logic gate 330.

The logic gate 330 may generate a repair enable signal REN based on the bit signals in the repair control signals RCTR. For example, if one of the bit signals is activated to the logic high level, it indicates that the repair operation has to be executed, and, if all of the bit signals are deactivated to the logic low level, it indicates that the repair operation is not required. In this case, the logic gate 330 may be implemented with an OR logic gate, such that the logic high level of the repair enable signal REN may indicate the repair operation and the logic low level of the repair enable signal REN may indicate the normal operation.

When the repair enable signal REN has the logic low level, the redundancy column selection circuit 320 is disabled and the normal column selection circuit 310 is enabled to perform the normal operation. In the normal operation, one of the normal bitlines corresponding to the input column address ICADD to access the memory cell MC. When the repair enable signal REN has the logic high level, the normal column selection circuit 310 is disabled and the redundancy column selection circuit 320 is enabled to perform the repair operation. In the repair operation, one of the redundancy bitlines corresponding to the repair control signal RCTR to access the redundancy memory cell RC instead of the memory cell MC.

Figure 8:
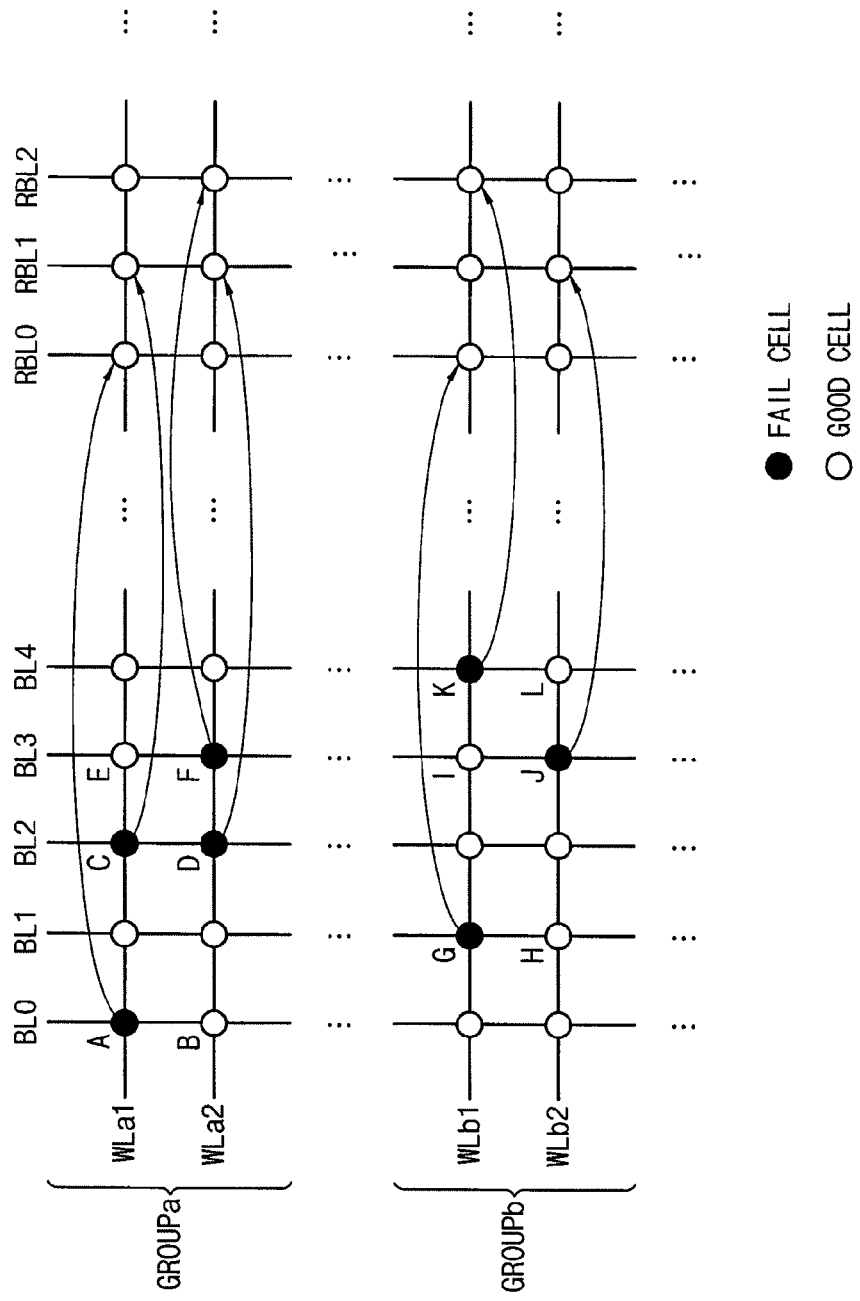
FIG. 8 illustrates a diagram for describing a group-by group repair operation according to an example embodiment of the inventive concept.

FIG. 8 illustrates a diagram for describing a group-by group repair operation according to an example embodiment of the inventive concept. As an example, FIG. 8 illustrates a first fail row group GROUPa including a first wordline WLa1 and a second wordline WLa2, and a second fail row group GROUPb including a third wordline WLb1 and a fourth wordline WLb2. Depending on the grouping method, one or more wordlines of the other row groups may exist between the first wordline WLa1 and the second wordline WLa2 or between the third wordline WLb1 and the fourth wordline WLb2.

As described above, the repair control circuit 400 stores the first fail group address corresponding to the first fail row group GROUPa and the three fail column addresses corresponding to the normal bitlines BL0, BL2, and BL3 to which the fail memory cells A, C, D, and F are coupled. Also the repair control circuit 400 stores the second fail group address corresponding to the second fail row group GROUPb and the three fail column addresses corresponding to the normal bitlines BL1, BL3 and BL4 to which the fail memory cells G, J and K are coupled.

The repair operation is performed group-by-group as follows.

In case of the repair operation for the first fail row group GROUPa, the fail memory cell A and the good memory cell B coupled to the first normal bitline BL0 are replaced with the redundancy memory cells coupled to the first redundancy bitline RBL0, because the row addresses of the first and second wordlines WLa1 and WLa2 are converted to the same first fail group address. In the same way, the memory cells C and D coupled to the third normal bitline BL2 are replaced with the redundancy memory cells coupled to the second redundancy bitline RBL1, and the memory cells E and F coupled to the fourth normal bitline BL3 are replaced with the redundancy memory cells coupled to the third redundancy bitline RBL2.

In case of the repair operation for the second fail row group GROUPb, the fail memory cell G and the good memory cell H coupled to the second normal bitline BL1 are replaced with the redundancy memory cells coupled to the first redundancy bitline RBL0, because the row addresses of the third and fourth wordlines WLb1 and WLb2 are converted to the same second fail group address. In the same way, the memory cells I and J coupled to the fourth normal bitline BL3 are replaced with the redundancy memory cells coupled to the second redundancy bitline RBL1, and the memory cells K and L coupled to the fifth normal bitline BL4 are replaced with the redundancy memory cells coupled to the third redundancy bitline RBL2.

As a result, first memory cells and second memory cells may be replaced with the redundancy memory cells coupled to the same redundancy bitline, where the first memory cells and second memory cells are coupled to the different normal bitlines and included in the different row groups. For example, the redundancy memory cells of the first redundancy bitline RBL0 may replace the first memory cells A and B of the first normal bitline BL0 and the first fail row group GROUPa and the second memory cells G and H of the second normal bitline BL1 and the second fail row group GROUPb.

Through such group-by-group repair operation, the repair resources may be used efficiently and thus the integration rate of the semiconductor memory device may be enhanced.

Figure 9:
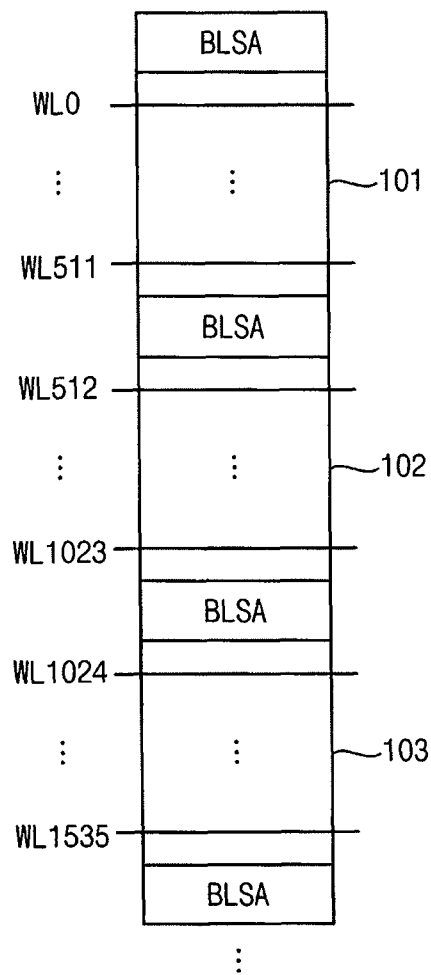
FIG. 9 illustrates a diagram of an example layout of a memory cell array in the semiconductor memory device of FIG. 1.

FIG. 9 illustrates a diagram of an example layout of a memory cell array in the semiconductor memory device of FIG. 1. Referring to FIG. 9, the memory cell array 100a may include a plurality of sub arrays 101, 102, and 103, and the bitline sense amplifier circuits BLSAs may be disposed between the sub arrays 101, 102, and 103.

The sub arrays 101, 102, and 103 may each include the same number of wordlines. For example, each of the sub arrays 101, 102, and 103 may include 512 wordlines as illustrated in FIG. 9. In such a layout of the memory cell array 100a, the wordlines disposed in the same portion of the respective sub arrays 101, 102, and 103 may have the same characteristics. In this case, the above-mentioned row groups may be determined by grouping the remainder of the row addresses when divided by a reference value, wherein the reference value may correspond to the number of the wordlines in each sub array.

Figures 10, 11:
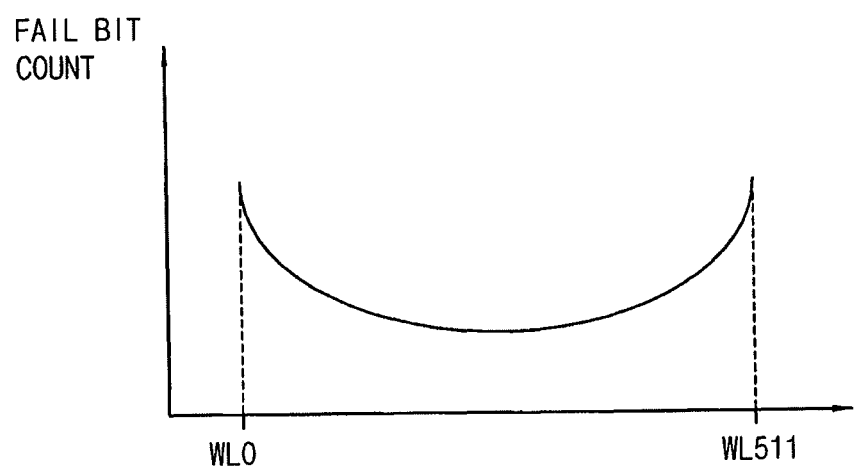
FIG. 10 illustrates a diagram of a method of determining row groups according to an example embodiment of the inventive concept.
FIG. 11 illustrates a diagram of a fail bit count distribution depending on wordline positions.

FIG. 10 illustrates a diagram of a method of determining row groups according to an example embodiment of the inventive concept.

Referring to FIG. 10, the row groups may be determined by uniformly grouping the remainders of the row addresses when divided by the reference value (e.g., 512). Each row group includes 64 row addresses of 64 wordlines and, thus, the 512 row addresses may be grouped into eight row groups represented by the group indices 0 to 7. FIG. 10 illustrates an example of the group addresses indicating the first row group (group index 0) to the eighth row group (group index 7) and the group bits. Referring to the example logic values of the group bits, the third row group (group index 2), the fourth row group (group index 3), the sixth row group (group index 5), and the seventh row group (group index 6) correspond to the fail row groups. As described above, the fail group addresses (010, 011, 101, 110) may be stored as the fail group information FGI or the group bits mapped to the group indices may be stored in the bloom filter table as the fail group information FGI.

Figures 12, 13:
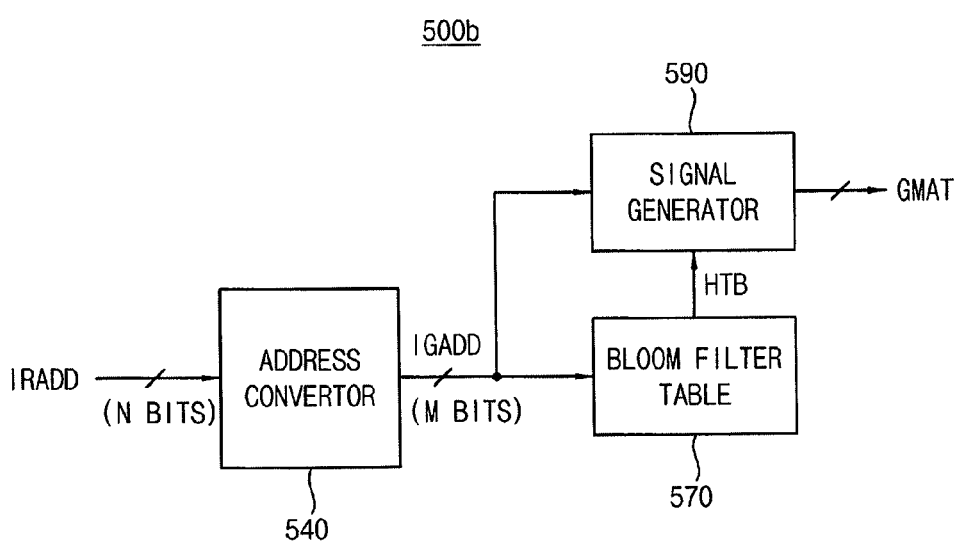
FIG. 12 illustrates a diagram of a method of determining row groups according to an example embodiment of the inventive concept.
FIG. 13 illustrates a diagram of a row matching block in the repair control circuit in FIG. 1 according to an example embodiment of the inventive concept.

FIG. 11 illustrates a diagram of a fail bit count distribution depending on wordline positions. FIG. 12 is a diagram illustrating a method of determining row groups according to an example embodiment of the inventive concept.

Referring to FIG. 11, the fail bit count, i.e., the number of the fail memory cells in a wordline may increase for wordlines disposed near the edge portions. In other words, the wordlines WL0 and WL511 in the boundary of the sub array may have more fail memory cells associated therewith than remaining wordlines. In this case, the row groups may be determined as illustrated in FIG. 12, such that a number of wordlines of a first row group corresponding to an edge portion of each sub array is smaller than a number of wordlines of a second row group closer to a center portion of each sub array. For example, remaining wordlines may be grouped such that each of the row groups (group indices 0, 1, 2, 5, 6 and 7) near the upper and bottom edge portions of the sub array may include one wordline and each of the row groups (group indices 3 and 4) near the center portion of the sub array may include 253 wordlines. As such, by assigning mroe repair resources to the row groups having higher probability of the fail memory cells, the repair resources may be distributed efficiently.

FIG. 13 illustrates a diagram of a row matching block in the repair control circuit in FIG. 1 according to an example embodiment of the inventive concept. FIG. 13 illustrates a row matching block 500b having a configuration of a bloom filter. Referring to FIG. 13, the row matching block 500b may include an address convertor 540, a bloom filter table 570, and a signal generator 590.

The bloom filter table 570 stores the group bits that are mapped to the group indices indicating the corresponding row groups as described with reference to FIG. 4. The fail group information FGI may be represented, such that the first logic value (e.g., the logic high value "1") is written in the group bits mapped to the group indices 0, 3, 4, 6 and 7 to indicate the fail row groups and the second logic value (e.g., the logic low value "0") is written in the other group bits mapped to the group indices 1, 2 and 5.

The address convertor 540 converts the input row address IRADD to an input group address IGADD indicating the row group including the input row address IRADD. The bit number M of the input group address IGADD is smaller than the bit number N of the input row address.

The signal generator 590 extracts the logic value of the group bit corresponding to the input group address IGADD from the bloom filter table 570 to generate the group match signal GMAT. For example, the bloom filter table 570 may generate a hit signal HTB that is activated when the logic value of the group bit corresponding to the input group address IGADD indicates the fail row block. The group match signal GMAT may include the plurality of bit signals GMAT[0] to GMAT[k] to indicate the fail row group including the input row address IRADD. When the hit signal HTB is activated, the signal generator 590 may activate the one bit signal corresponding to the input group address IGADD among the bit signals GMAT[0] to GMAT[k] in response to the input group address IGADD.

As such, by grouping the row addresses and storing and using the group bits as the fail group information FGI, efficient repair operation may be implemented and the integration rate and yield of the memory device may be enhanced.

Figure 14:
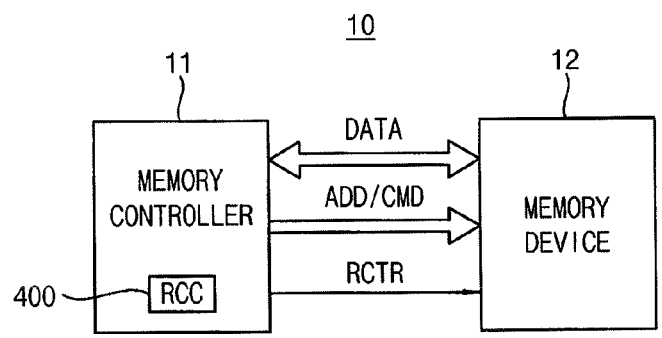
FIGS. 14 and 15 illustrates diagrams of a memory system according to example embodiments of the inventive concept.
Figure 15:
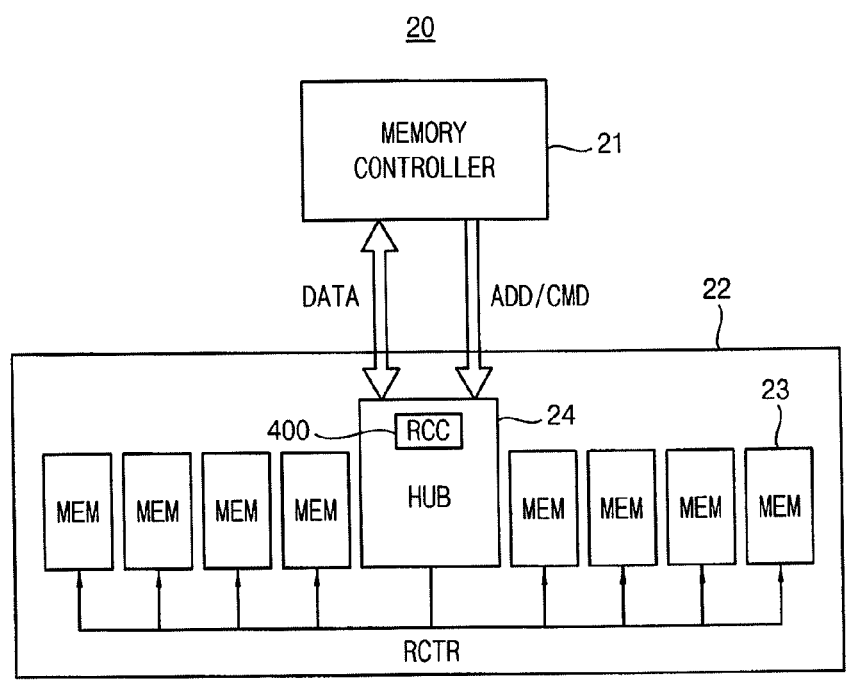

FIGS. 14 and 15 illustrate diagrams of a memory system according to example embodiments of the inventive concept.

Referring to FIG. 14, a memory system 10 may include a memory controller 11 and a semiconductor memory device 12. Based on the address ADD and the command CMD, the semiconductor memory device 12 may perform the read operation or the write operation to transfer the read data and the write data with the memory controller 11.

Different from the repair control circuit 400 in the semiconductor memory device 1000 of FIG. 1, the repair control circuit RCC 400 may be included in the memory controller 11 as illustrated in FIG. 14. In this case, the memory controller 11 may access the redundancy memory cells in the semiconductor memory device 12 using the repair control signal RCTR.

Referring to FIG. 15, a memory system 20 may include a memory controller 21 and a memory module 22. The memory module 22 may include a plurality of memory chips (MEM) 23 and a module hub 24 or a buffer chip to control the access to the memory chips 23.

Different from the above described embodiments, the repair control circuit RCC 400 may be included in the module hub 24 as illustrated in FIG. 15. In this case, the memory controller 21 and/or the module hub 24 may access the redundancy memory cells in the memory chips 23 using the repair control signal RCTR.

Figure 16:
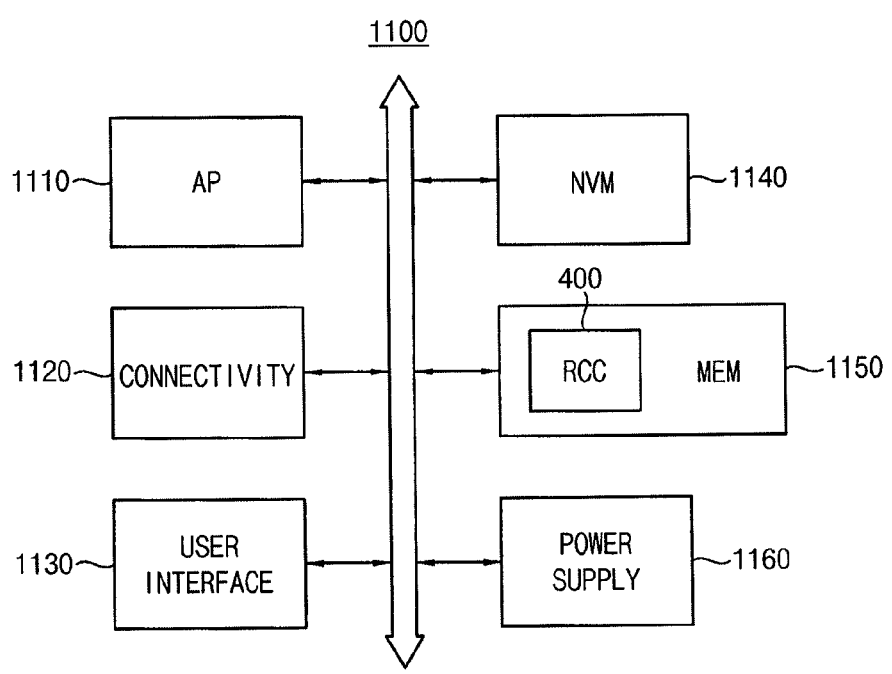
FIG. 16 illustrates a block diagram of a mobile system according to an example embodiment.

FIG. 16 illustrates a block diagram of a mobile system according to an example embodiment. Referring to FIG. 16, a mobile system 1100 includes an application processor 1110, a connectivity unit 1120, a memory device 1150, a nonvolatile memory device 1140, a user interface 1130, and a power supply 1160. In some embodiments, the mobile system 1100 may be a mobile phone, a smart phone, a personal digital assistant (PDA), a portable multimedia player (PMP), a digital camera, a music player, a portable game console, a navigation system, etc.

The application processor 1110 may execute applications, such as a web browser, a game application, a video player, etc. In some embodiments, the application processor 1110 may include a single core or multiple cores. For example, the application processor 1110 may be a multi-core processor, such as a dual-core processor, a quad-core processor, a hexa-core processor, etc. The application processor 1110 may include an internal or external cache memory.

The connectivity unit 1120 may perform wired or wireless communication with an external device. For example, the connectivity unit 1120 may perform Ethernet communication, near field communication (NFC), radio frequency identification (RFID) communication, mobile telecommunication, memory card communication, universal serial bus (USB) communication, etc. In some embodiments, the connectivity unit 1120 may include a baseband chipset that supports communications, such as global system for mobile communications (GSM), general packet radio service (GPRS), wideband code division multiple access (WCDMA), high speed downlink/uplink packet access (HSxPA), etc.

The memory device 1150 may store data processed by the application processor 1110 or may operate as a working memory. According to example embodiments, the memory device 1150 includes the repair control circuit (RCC) 400. The repair control circuit 400 may include the row matching block 500 and the column matching block 600 as described with reference to FIG. 1. The row matching block 500 stores the fail group information FGI and generates a group match signal GMAT based on the input row address IRADD and the stored fail group information FGI such that the group match signal GMAT may indicate whether the row group including the input row address IRADD is the fail row group or not. The column matching block 600 stores the fail column addresses FCA and generates the repair control signal RCTR based on the input column address ICADD, the group match signal GMAT, and the stored fail column addresses FCA such that the repair control signal RCTR may indicate whether the repair operation has to be executed or not.

For example, the memory device 1150 may be a dynamic random access memory, such as DDR SDRAM, LPDDR SDRAM, GDDR SDRAM, RDRAM, etc., or may be any volatile memory device that requires the repair operation. The nonvolatile memory device 1140 may store a boot code for booting the mobile system 1100. For example, the nonvolatile memory device 1140 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 1130 may include at least one input device, such as a keypad, a touch screen, etc., and at least one output device, such as a speaker, a display device, etc. The power supply 1160 may supply a power supply voltage to the mobile system 1100. In some embodiments, the mobile system 1100 may further include a camera image processor (CIS), and/or a storage device, such as a memory card, a solid state drive (SSD), a hard disk drive (HDD), a CD-ROM, etc.

In some embodiments, the mobile system 1100 and/or components of the mobile system 1100 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 17:
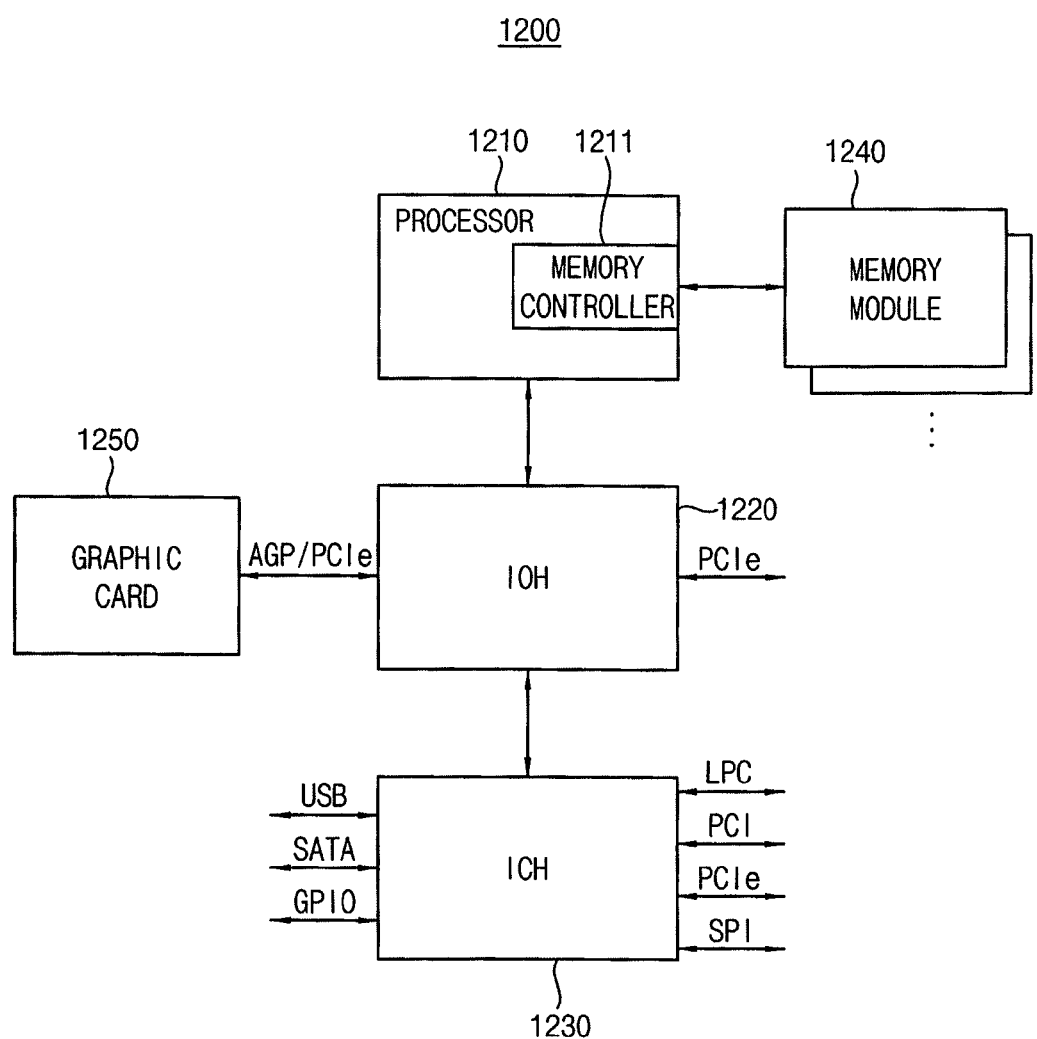
FIG. 17 illustrates a block diagram of a computing system according to an example embodiment.

FIG. 17 illustrates a block diagram of a computing system according to an example embodiment. Referring to FIG. 17, a computing system 1200 includes a processor 1210, an input/output hub (IOH) 1220, an input/output controller hub (ICH) 1230, at least one memory module 1240, and a graphics card 1250. In some embodiments, the computing system 1200 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 1210 may performing various computing functions, such as executing specific software for performing specific calculations or tasks. For example, the processor 1210 may be a microprocessor, a central process unit (CPU), a digital signal processor, or the like. In some embodiments, the processor 1210 may include a single core or multiple cores. For example, the processor 1210 may be a multi-core processor, such as a dual-core processor, a quad-core processor, a hexa-core processor, etc. Although FIG. 17 illustrates the computing system 1200 including one processor 1210, in some embodiments, the computing system 1200 may include a plurality of processors. The processor 1210 may include an internal or external cache memory.

The processor 1210 may include a memory controller 1211 for controlling operations of the memory module 1240. The memory controller 1211 included in the processor 1210 may be referred to as an integrated memory controller (IMC). A memory interface between the memory controller 1211 and the memory module 1240 may be implemented with a single channel including a plurality of signal lines, or may be implemented with multiple channels, to each of which at least one memory module 1240 may be coupled. In some embodiments, the memory controller 1211 may be located inside the input/output hub 1220, which may be referred to as memory controller hub (MCH).

The memory module 1240 may include a plurality of memory devices that store data provided from the memory controller 1211. The repair control circuit according to example embodiments may be included in the memory controller 1211 or a buffer chip in the memory module 1240. In some example embodiments, a plurality of repair control circuits may be included respectively in the memory chips in the memory module 1240.

The input/output hub 1220 may manage data transfer between processor 1210 and devices, such as the graphics card 1250. The input/output hub 1220 may be coupled to the processor 1210 via various interfaces. For example, the interface between the processor 1210 and the input/output hub 1220 may be a front side bus (FSB), a system bus, a Hyper-Transport, a lightning data transport (LDT), a QuickPath interconnect (QPI), a common system interface (CSI), etc. Although FIG. 17 illustrates the computing system 1200 including one input/output hub 1220, in some embodiments, the computing system 1200 may include a plurality of input/output hubs. The input/output hub 1220 may provide various interfaces with the devices. For example, the input/output hub 1220 may provide an accelerated graphics port (AGP) interface, a peripheral component interface-express (PCIe), a communications streaming architecture (CSA) interface, etc.

The graphics card 1250 may be coupled to the input/output hub 1220 via AGP or PCIe. The graphics card 1250 may control a display device (not shown) for displaying an image. The graphics card 1250 may include an internal processor for processing image data and an internal memory device. In some embodiments, the input/output hub 1220 may include an internal graphics device along with or instead of the graphics card 1250 outside the graphics card 1250. The graphics device included in the input/output hub 1220 may be referred to as integrated graphics. Further, the input/output hub 1220 including the internal memory controller and the internal graphics device may be referred to as a graphics and memory controller hub (GMCH).

The input/output controller hub 1230 may perform data buffering and interface arbitration to efficiently operate various system interfaces. The input/output controller hub 1230 may be coupled to the input/output hub 1220 via an internal bus, such as a direct media interface (DMI), a hub interface, an enterprise Southbridge interface (ESI), PCIe, etc. The input/output controller hub 1230 may provide various interfaces with peripheral devices. For example, the input/output controller hub 1230 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 1210, the input/output hub 1220 and the input/output controller hub 1230 may be implemented as separate chipsets or separate integrated circuits. In other embodiments, at least two of the processor 1210, the input/output hub 1220 and the input/output controller hub 1230 may be implemented as a single chipset.

The present inventive concept may be applied to any memory device that requires a repair control circuit to control a repair operation and to a system including the memory device. The present inventive concept may be applied to systems such as be a mobile phone, a smart phone, a personal digital assistant (PDA), a portable multimedia player (PMP), a digital camera, a music player, a portable game console, a navigation system, etc.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A repair control circuit controlling a repair operation of a semiconductor memory device, the repair control circuit comprising:
a row matching block to store fail group information indicating one or more fail row groups among a plurality of row groups, the row groups being determined by grouping a plurality of row addresses corresponding to a plurality of wordlines according to a grouping method, each of the fail row groups including one or more fail row addresses of fail memory cells, the row matching block to generate a group match signal based on an input group address obtained by converting an input row address according to the grouping method and the fail group information, wherein the group match signal indicates the fail row group including the input row address; and
a column matching block to store fail column addresses of the fail memory cells, and to generate a repair control signal based on input column address, the group match signal, and the fail column addresses, wherein the repair control signal indicates whether the repair operation is to be executed or not.

2. The repair control circuit as claimed in claim 1, wherein the row matching block stores fail group addresses as the fail group information, the fail group addresses indicating the fail row groups, a bit number of each fail group address being smaller than a bit number of each fail row address.

3. The repair control circuit as claimed in claim 2, wherein the fail group addresses are hashing values converted from the fail row addresses using a hashing function.

4. The repair control circuit as claimed in claim 2, wherein the fail group addresses are determined by grouping remainders of the fail row addresses when divided by a reference value, a memory cell array of the semiconductor memory device including a plurality of sub arrays, the reference value corresponding to a number of wordlines in each sub array.

5. The repair control circuit as claimed in claim 4, wherein a number of wordlines in a first row group at an edge portion of each sub array is smaller than a number of wordlines in a second row group at a center portion of each sub array.

6. The repair control circuit as claimed in claim 2, wherein the row matching block includes:
a group address storage to store the fail group addresses;
an address convertor to convert the input row address into an input group address indicating the row group including the input row address; and
a group comparator to compare the input group address with the fail group addresses to generate the group match signal.

7. The repair control circuit as claimed in claim 1, wherein the row matching block stores group bits as the fail group information, the group bits respectively corresponding to the row groups, each group bit having a first logic value when the corresponding row group is the fail row group and a second logic value when the corresponding row group is not the fail row group.

8. The repair control circuit as claimed in claim 7, wherein the row matching block includes:
a bloom filter table to store the group bits;
an address convertor to convert the input row address to an input group address indicating the row group including the input row address; and
a signal generator to extract the logic value of the group bit corresponding to the input group address from the bloom filter table and to generate the group match signal.

9. The repair control circuit as claimed in claim 1, wherein the column matching block includes:

a column address storage to store the fail column addresses, and to output the fail column addresses corresponding to the fail row group including the input row address in response to the group match signal; and
a column comparator to compare the input column address with the fail column addresses output from the column address storage to generate the repair control signal.

10. The repair control circuit as claimed in claim 9, wherein:
the column address storage includes a plurality of storage units for storing the one or more fail column addresses with respect to each fail row group, and
the repair control signal includes a plurality of bit signals indicating a column address of the redundancy memory cell for replacing the fail memory cell corresponding to the input row address and the input column address, and indicating whether the repair operation is to be executed or not.

11. The repair control circuit as claimed in claim 1, wherein a bit number of the input group address is smaller than a bit number of the input row address.

12. A semiconductor memory device, comprising:
a memory cell array including a plurality of memory cells coupled to a plurality of wordlines and a plurality of normal bitlines, respectively, and a plurality of redundancy memory cells coupled to the plurality of wordlines and a plurality of redundancy bitlines;
a row selection circuit to select one of the wordlines based on an input row address;
a column selection circuit to select one of the normal bitlines based on an input column address in a normal operation and to select one of the redundancy bitlines based on a repair control signal in a repair operation; and
a repair control circuit to store fail group information and fail column addresses of fail memory cells, the fail group information indicating one or more fail row groups among a plurality of row groups, the row groups being determined by grouping a plurality of row addresses corresponding to the plurality of wordlines according to a grouping method, each of the fail row groups including one or more fail row addresses of the fail memory cells, the repair control circuit to generate the repair control signal based on an input group address obtained by converting the input row address according to the grouping method, the input column address, the fail group information, and the fail column addresses.

13. The semiconductor memory device as claimed in claim 12, wherein the repair control circuit includes:
a row matching block to store the fail group information and to generate a group match signal based on the input row address and the fail group information, wherein the group match signal indicates whether the row group including the input row address is the fail row group or not; and
a column matching block to store the fail column addresses and to generate the repair control signal based on the input column address, the group match signal and the fail column addresses, wherein the repair control signal indicates whether the repair operation is to be executed or not.

14. The semiconductor memory device as claimed in claim 13, wherein the row matching unit includes:
a group address storage to store fail group addresses as the fail group information, the fail group addresses indicating the fail row groups, a bit number of each fail group address being smaller than a bit number of each fail row address.

15. The semiconductor memory device as claimed in claim 13, wherein the row matching block includes:
a bloom filter table to store group bits as the fail group information, the group bits respectively corresponding to the row groups, each group bit having a first logic value when the corresponding row group is the fail row group and a second logic value when the corresponding row group is not the fail row group.

16. The semiconductor memory device as claimed in claim 13, wherein the row matching block includes:
an address convertor to convert the input row address to an input group address indicating the row group including the input row address.

17. The semiconductor memory device as claimed in claim 12, further comprising:
a non-volatile memory to store the fail group information and the fail column addresses,
wherein the fail group information and the fail column addresses in the non-volatile memory are loaded to a volatile memory included in the repair control circuit during an initializing process of the semiconductor memory device.

18. The semiconductor memory device as claimed in claim 12, wherein first memory cells and second memory cells are replaced with redundancy memory cells coupled to a same redundancy bitline, where the first memory cells and second memory cells are coupled to different normal bitlines and included in different row groups.

19. A repair control circuit controlling a repair operation of a semiconductor memory device, the repair control circuit comprising:
a memory to store fail group information and fail column addresses of fail memory cells, the fail group information indicating one or more fail row groups among a plurality of row groups;
an address convertor to generate the plurality of the row groups by grouping a plurality of row addresses corresponding to a plurality of wordlines into the plurality of row groups according to a grouping method, each of the fail row groups including one or more fail row addresses of the fail memory cells; and
a comparison unit to generate the repair control signal based on an input group address obtained by converting an input row address according to the grouping method, an input column address, the fail group information, and the fail column addresses.

20. The repair control circuit as claimed in claim 19, wherein the fail group addresses are determined by grouping remainders of the fail row addresses when divided by a reference value, a memory cell array of the semiconductor memory device including a plurality of sub arrays, the reference value corresponding to a number of wordlines in each sub array.

21. The repair control circuit as claimed in claim 20, wherein a number of wordlines in a first row group at an edge portion of each sub array is smaller than a number of wordlines of a second row group at a center portion of each sub array.

* * * * *